United States Patent [19]

Knierim

[11] Patent Number: 4,780,755
[45] Date of Patent: Oct. 25, 1988

[54] FRAME BUFFER SELF-TEST

[75] Inventor: David L. Knierim, Wilsonville, Oreg.

[73] Assignee: Tektronix, Inc., Beaverton, Oreg.

[21] Appl. No.: 113,838

[22] Filed: Oct. 26, 1987

[51] Int. Cl.$^4$ .................. H04N 17/04; H04N 17/02
[52] U.S. Cl. ........................... 358/10; 324/121 R; 358/139
[58] Field of Search .............. 358/10, 139; 324/121 R

[56] References Cited

U.S. PATENT DOCUMENTS

| | | | |
|---|---|---|---|
| 4,536,760 | 8/1985 | Navarro | 324/121 R |
| 4,607,288 | 8/1986 | Freyberger | 358/10 |
| 4,628,254 | 12/1986 | Bristol | 324/121 R |
| 4,700,227 | 10/1987 | Liebel | 358/139 |

*Primary Examiner*—Howard W. Britton
*Attorney, Agent, or Firm*—Alexander C. Johnson, Jr.; Robert S. Hulse

[57] ABSTRACT

A color graphic display system has self-test capability for testing system elements between the frame buffer and the display monitor inputs. The DAC output analog signals are converted to a digital signal and processed to provide an output test bit, which is input to the graphics processor. Additional self-test hardware includes address and data lines from the graphics processor to the color map for directly loading test bit patterns into the color map. The system self-tests the frame buffer, shift registers and DACs by loading various predetermined test bit patterns into the frame buffer and the color map; cycling that data through the display system; reading the test bit; comparing the output test bit values to expected values; and reporting any errors detected. The system also includes a method for self-testing the refresh counter address path into the frame buffer.

13 Claims, 2 Drawing Sheets

FRAME BUFFER SELF-TEST

RELATED APPLICATION DATA

This application is related to commonly-assigned U.S. patent application Ser. No. 07/113,590 filed on Oct. 26, 1987 by Darrell D. Irvin, entitled METHOD OF LOW-COST SELF-TEST IN A VIDEO DISPLAY SYSTEM.

BACKGROUND OF THE INVENTION

This invention relates generally to circuitry and methods for self-testing various elements in a graphic display device, more particularly to self-test by the system of system elements between the frame buffer memory DRAMs and the inputs to a graphic display monitor.

It is becoming common for graphics systems to test themselves without the aid of external fixtures or human observation. This includes both power-on self-test and extended diagnostics of digital circuitry in the graphics system. Most of the system up to and including the frame buffer can be tested without the use of external test instrumentation or feedback from an observer.

One exception has been the display of video information on the monitor. Hardware from the video shift registers to the CRT electron gun has only been testable by viewing the resultant displays on the CRT screen.

The frame buffer itself can be tested by writing test data into the frame buffer and then reading back the test data and comparing it with the input test data. Although the color map itself is testable, it is hard, however, to test the video shift registers feeding the color map and the data path between the color map and the DACs. In normal system operation, there in only a one directional data path out of the frame buffer through the color map and DACs and so its signals cannot be read by the system's processor. It is also hard to test these components by examining the signals at the outputs of the DACs by use of external test instrumentation. In prior systems, everything from the frame buffer outputs downstream to the CRT display, except the color map RAM, is not automatically testable. Its operation can only be observed by looking at the CRT display and working back manually.

Accordingly, a need remains for a better way to test elements of a graphics system between the frame bclffer and the CRT display monitor.

SUMMARY OF THE INVENTION

This invention provides an inexpensive way to test the system downstream from the frame buffer: from the frame buffer DRAMS through the digital to analog converters (DAC) and video amplifiers.

More specifically, it provides a display system with video analog self-test capability and methods of selftesting in a video display system. The display system includes a graphics processor, a frame buffer, shift registers and a color map or grey scale map for generating digital video data. It further includes a digital to analog converter (DAC) for receiving the digital video data and converting it to an analog signal for input to a cathode ray tube monitor to display an image. In an color system, for example an RGB system, three DACs are provided for receiving the digital video data and converting it into three analog signals representing the colors red, green and blue, respectively.

Self-test hardware includes a non-inverting amplifier or comparator for converting the DAC output analog signal to a digital signal. The analog signal is connected to the non-inverting (plus) input of the comparator. A reference voltage source having a DC voltage level approximately equal to the mid-point of the output voltage swing of the DAC is presented at the inverting (minus) input of the comparator.

The self-test hardware also includes a flip-flop having Set and Reset inputs and an output. The digital signal output from the comparator is connected to the Set input of the flip-flop. The flip-flop has an output connected to an input port of the graphics processor for outputting a test bit. The self-test circuitry thus provides a feedback path from the DAC output to the graphics processor. A digital output port from the graphics processor is connected to operate the Reset input of the flip-flop. In a color system, the three analog output signals from the DACs are presented via three comparators, respectively, to the inputs of a logic OR gate. The output signal of the OR gate is presented to the Set input of the flip-flop.

The self-test hardware enables the display system to self-test itself downstream from the frame buffer, i.e., from the frame buffer DRAMs through the DACs and video amplifiers. The system first self-tests the DACs by loading the color map or grey scale map with all zeros; clearing the flip-flop; waiting at least a frame time period; reading the test bit; comparing the test bit value to an expected value; and reporting any error detected. Individual DACs are checked for outputting a high level by loading Ones in a section of the color map corresponding to the color of interest, waiting at least a frame time, reading the test bit and comparing the test bit value to an expected value. This step is repeated for each of the three DACs in an RGB system.

To test the video frame buffer and shift registers for passing zeros, the system executes the following steps: clear the frame buffer (all pixels =0); load the zero location of the color map with Zeros; load the color map locations other than the zero location with Ones; clear the flip-flop; wait at least one frame time period; read the test bit; compare the test bit value to an expected value; and report any error detected.

The frame buffer and shift registers are tested for passing a One by setting one bit in the video frame buffer, clearing the flip-flop, waiting a sufficient time period for the set bit to be displayed, reading the test bit, comparing the test bit value to an expected value, and checking that only the correct shift register bit is set.

The checking is accomplished by clearing location A of the color map, where N is the number of planes of video frame buffer and A equals $2^N-1$, loading a One in the same bit location of one selected word in all planes of the frame buffer, clearing the flip-flop, waiting a sufficient time period for the selected word to be displayed, reading the test bit, and comparing the test bit value to an expected value. The above steps are repeated for each bit location in the selected word in the video frame buffer, thereby testing all bit locations in the shift registers.

Finally, the system tests the refresh counter address path into the frame buffer by clearing the video frame buffer; loading the color map with Ones, except for location zero; loading zeros into location zero of the color map; clearing the flip-flop; reading the refresh counter; setting one bit of a word in the frame buffer about to be displayed; reading the test bit; comparing the test bit to an expected value. The foregoing steps are repeated for each address of the output refresh counter.

DETAILED DESCRIPTION

Figure 1:
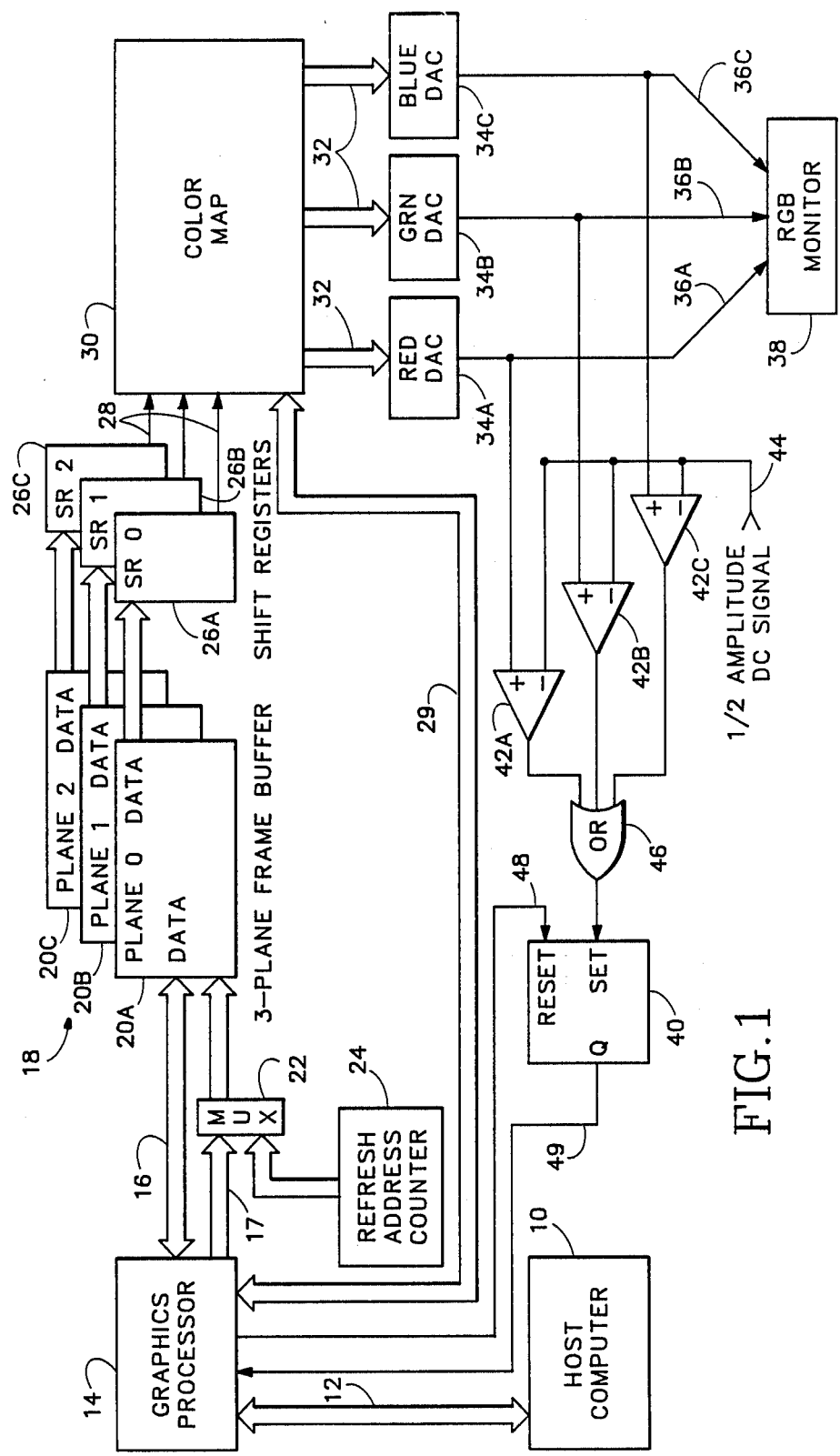
FIG. 1 is a block diagram of a CRT graphics systems incorporating frame buffer self-test circuitry in accordance with the invention.

FIG. 1 shows a typical graphics display system in which the invention is implemented. This system includes a host computer 10 which exchanges data by way of a suitable bus 12 with a graphics process or or picture processor 14. This data includes graphics commands which are translated by the graphics processor and associated circuitry into pixel data. The pixel data, typically including a pixel address ad pixel value, is sent by way of a second bus 16 (for data) and 17 (for address and control) to a frame buffer subsystem 18.

The frame buffer includes several (N) planes (for color) of frame buffer memory for storing the pixel values in the addressed locations and outputting them a raster line at a time and a pixel at a time in each raster line. In this illustrative example, three planes 20A, 20B and 20C are shown for storing 3-bit pixel values, corresponding to eight color shades. The frame buffer subsystem conventionally includes circuitry (not shown) which addresses the frame buffer for loading of pixel values into the appropriate address locations. Control information from the graphics processor is input to this circuitry by way of a multiplexer 22 in bus 17. A second set of control and address data is input through multiplexer 22 from a refresh address counter 24.

Pixel data is output a M-bit word at a time (corresponding to the number of bits M in each shift register) from each of the N planes of the frame buffer to a set of N parallel-to-serial shift registers 26A, 26B and 26C corresponding to the planes of the frame buffer. Each pixel value is output from these shift registers serially (three parallel bits in a three plane buffer system) over output lines 28 to a color map 30. Values in the color map can be loaded directly from the processor 14 via address and bi-directional data lines 29. In normal operation of the system, the color map provides three sets of digital outputs 32 to digital-to-analog converters, referred to herein as the red DAC 34A, the green DAC 34B and the blue DAC 34C. Each of the DACs outputs an analog signal via its respective output line 36A, 36B, 36C, to RGB monitor 38.

The color map is a look-up which translates pixel values from the shift registers into RGB (red, green and blue) triplets which are groups of three digital words that feed the DACs. The color map can be written to and read from the graphics processor, so it can be tested even without this invention. The parts not previously tested are the address path from the refresh address counter 24 to the frame buffer and the data paths from the video DRAMs through the shift registers to the color map and from the color map RAMs through the DACs to the video amplifiers. This invention enables these portions to be tested at the full operational speed of the graphics display system.

The test hardware includes a test flip-flop 40 that is set by a single pixel pulse on the video outputs. If all the DACs are not to be included in the test, a single comparator can connected to any one of the DAC outputs. Preferably all of the DACs are tested, in which case a pulse on any of the three video lines 36A, 36B, 36C must set the flip-flop 40. These video signals are sampled by comparators, 42A, 42B, 42C. These comparators can be relatively inaccurate but must be fast enough to respond to a one-pixel wide pulse. The comparators have a reference input line 44 which provides a DC level roughly halfway between the DACs' minimum and maximum output levels. If the video levels are appropriate, they could be sampled directly by a logic gate, which would provide an equivalent comparator function.

The output of each of these comparators is input to an OR gate 46 which has an output connected to the "set" input of the flip-flop 40. The "reset" input of the flip-flop is connected via line 48 to receive a reset signal from the graphics processor. The "Q" output of the flip-flop is connected via line 49 to provide a test bit input to the graphics processor.

Figure 2:
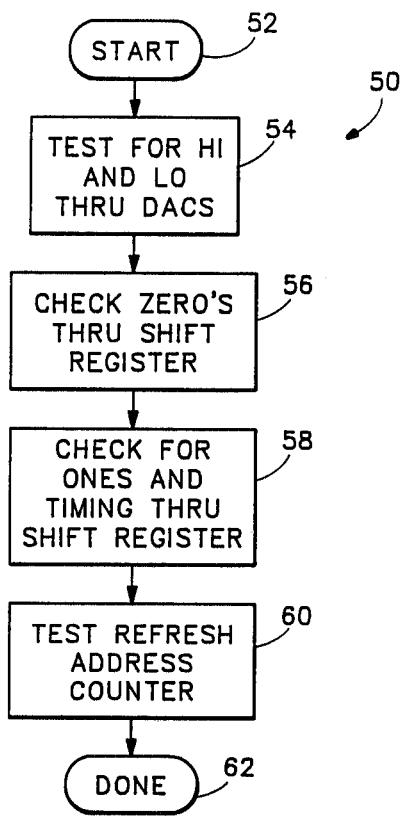
FIG. 2 is a flow chart of software for executing the process for self-testing in the system of FIG. 1.

FIG. 2 shows a flow chart of a software routine 50 for the sequence of testing that is conducted by the graphics processor 14 (or other microcomputer) using the circuitry of FIG. 1. The routine commences at "start" block 52 and proceeds through a series of tests identified by blocks 54, 56, 58, 60, and concludes at "done" block 62. The operation of the software within each of the test blocks is next described.

The flip-flop is read and cleared by any convenient processor, in FIG. 1 by the graphics control processor, which is conventionally implemented as a microcoded engine used for traversing display lists of graphics commands and drawing images into the frame buffer. This processor also has available information about the current scan line being displayed. A software timing loop triggered by the vertical sync or blank signals is sufficient for determining the current scan line although specific hardware for counting scan lines can be provided in the graphics processor. It is also possible, but more difficult, to do most of the testing without any direct access to the scan line count or vertical sync or blank signals.

Consider an example system with three planes of frame buffer (labeled 0-2) each feeding 10-bit (0-9) words to its corresponding 10 to 1 shift register. The 1-bit outputs of the three shift registers together form a 3-bit index (0-2) into the eight-entry color map. Each of the entries in the color map contains three 8-bit intensity values, one each for red, green and blue. Three 8-bit DACs convert these three intensity values into three analog levels which are amplified and sent to the monitor. The test circuit for this system is three simple comparators that detect video levels above roughly 50 percent brightness on each of the three video amplifier outputs. The three comparator outputs are logically OR'ed together to set the test flip-flop.

To test this graphics system, first the graphics processor, frame buffer and color map are tested in the conventional manner. Next, the DACs can be checked for outputting all black by loading the entire color map with zeros, clearing the test flip-flop, and waiting a frame time to see if the flip-flop is not set. These operations are performed by the graphics processor. The red DAC can be checked for outputting a high-level by loading the entire color map with ones in the red section and zeros in the green and blue sections, then clearing the test flip-flop and waiting to see that the test bit gets set. The green and blue DACs can be tested for outputting a high-level in the same manner. This also tests the comparators and the test flip-flop's ability to be set and cleared.

The video DRAM and shift registers can be checked for outputting zeros by writing zeros to the entire video DRAM and to the zero location of the color map. The rest of the color map is loaded with ones. The test flip-flop is cleared and checked a frame time later to verify that the test bit is not set. If any bit in the shift path does not stay at zero, then a non-zero location in the map will be addressed, causing the color map to output ones and to set the test bit.

Now that the video shift registers have been checked for passing zeros, they can be checked one bit at a time for passing a one. To check bit zero (pixel zero) of shift register zero (plane zero), bit zero of plane zero of one word in the video DRAM is set to one. The test flip-flop is cleared, then checked later to see if the test bit has been set. If scan line information is available to the graphics processor, then the processor can pick a word of the video DRAM that is about to be displayed. It can then wait a shorter time to see that the test flip-flop is set. If no scan line counter information is available, then the wait duration must be for an entire frame time (typically 1/60 second).

To check that only the correct bit is set (bit zero of shift register zero in this case), bit zero of all three planes of one word in the video DRAM are set to one. Location seven of the color map is cleared (all locations except zero where previously set).

The test bit is cleared and checked after this word has been displayed to see that it has not been set. If bit zero of plane zero had been shifted out at the wrong time, or shifted out for more than one pixel time, then location one of the color map would have been addressed, which would set the test bit. If the hardware is working properly, then only locations zero and seven are addressed, which are both cleared. The only way a failure in shift register zero bit zero would be missed, is if bit zero of each of the other two shift registers failed in exactly the same way, thus causing location seven of the color map to be addressed. If only some other shift registers fail or some fail in a different way, then locations or than zero and seven of the color map will be addressed and the test bit set.

All ten bits of all three shift registers can be checked one at a time as described above. Finally, the refresh counter address path into the video DRAM is tested. The video is cleared and the color map set to ones, except for zeros in location zero. The graphics processor then repeatedly clears the test bit, sets one bit in the video DRAM at a location about to be displayed (as determined by refresh counter information available to the graphics processor or code timing loops), then checks to see if the test if set shortly thereafter.

Following is an algorithmic description of the foregoing procedures for a three plane system. The procedure of block 54 tests the outputs of the digital to analog converters (DACs) 34 for high (1) and low (0) input signals.

1. Set entire Color map (all locations, all bits)=0; Execute steps 2 through 5. Set Color map (red bits, all locations)=1; Execute steps 2 through 5. Set Color map (red bits, all locations)=0, Color map (grn bits)=1; Execute steps 2 through 5. Set Color map (grn bits, all locations)=0, Color map (blu bits)=1; Execute steps 2 through 5. Go to block 56.
2. Clear test bit
3. Wait (e.g. at least vertical blanking time)
4. Read test bit
5. Compare test bit If the test bit does not compare with an expected (zero expected on first pass; ones expected on second, third and fourth passes) test bit value (block 55), then the system sends an error report. Otherwise, the test sequence continues for the remaining test conditions and, upon completion, moves to the procedure in block 56.

The block 56 procedure checks to see if zeros can get from the video RAMs through the shift registers to the color map as follows:

1. Set frame buffer (all pixels)=0
2. Load color map (at address location=0 load zeros into the red, green and blue data words and at all addresses>0, load ones in the red, green and blue data words)
3. Clear test bit
4. Wait (e.g. entire frame time)
5. Read test bit
6. Compare test bit If the test bit does not compare with an expected (zero expected) test bit value (block 57), then the system sends an error report. Otherwise, the test sequence moves to the procedure in block 58.

The block 58 procedure checks for ones, one bit at a time (plane 0,1,2) of one pixel (0 to M−1) at a time, through the shift registers as follows:

1. Set frame buffer (all pixels)=0
2. Load color map (at address=0)=0 and Load color map (all addresses>0) All bits=1
3. Do steps 4 through 18 for A=0 through M−1
4. Do steps 5 through 10 for B=0 through n−1
5. Clear test bit
6. Set a bit A of SR(B)=1 (this is done by setting a bit in the frame buffer that will be loaded into the required position of the shift register)
7. Wait (e.g. frame time)
8. Read test bit
9. Compare test bit (one is expected)
10. Clear the bit set in the frame buffer in step 6 Inner loop done.
11. Set Color map (Addr.=last, e.g. 7)=0
12. Clear test bit
13. Set bit A, of all N(e.g., 3) SR=0 (This is done by loading a pixel with a value $2^N-1$ (e.g., 7) in the frame buffer at a location which will load into bits A of the shift registers)
14. Wait (e.g., frame time)
15. Read test bit
16. Compare test bit (zero expected)
17. Set pixel set in step 13 back to zero
18. Load last location in color map, all bits=1 (undo step 11) End outer loop.

Once the procedure of block 58 is completed, the test sequence moves on to the procedure of block 60, which proceeds as follows:

1. Clear frame buffer
2. Load color map (at addresses 0)=0 and Load color map (all addresses>0) all bits=1
3. Clear test bit
4. Set a bit in the first pixel of the first scan line in frame buffer
5. Wait just until test bit is set, set timer
6. Do steps 7 through 12 for I=2 through last scan line
7. Clear first pixel of scan line I−1
8. Set a bit in first pixel of scan line I 9. Clear test bit 10. Wait just until test bit set 11. Check timer to verify that time is about one scan line time 12. Set timer End of loop, end of test. If the graphics processor is too slow, the loop of steps 7 through 12 may be performed for I incremented through odd values, then repeated for I incremented through even values. The refresh address check procedure (block 60) can be implemented using the graphics processor scan line counter but this is not necessary.

I claim:

1. A display system with video analog self-test capability comprising:
   means, including a graphics processor, a frame buffer, shift registers, and a color map or grey scale map, for generating digital video data;
   a digital to analog converter (DAC) for receiving the digital video data and converting the digital video data to an analog signal for input to a cathode ray tube monitor to display an image;
   a flip-flop having Set and Reset inputs and an output defining a test bit connected to an input port of the processor;
   means for inputting the analog signal from the DAC to the set input of the flip-flop;
   means in the processor for controlling the Reset input of the flip-flop; and
   means for cycling digital data through the shift registers to produce a test output analog signal from the DAC; and
   means in the processor for comparing the test output analog signal with a predetermined expected output.

2. The display system of claim 1 wherein said means for inputting the analog signal includes means connected to the DAC to receive the analog signal for converting the analog signal to a digital signal.

3. The display system of claim 2, wherein said means for converting the analog signal to a digital signal comprises:
   a reference voltage source having a DC voltage level approximately equal to halfway between the minimum output level of the DAC and the maximum output level of the DAC; and
   a comparator having its inverting (minus) input connected to the DC reference voltage source and its non-inverting (plus) input connected to receive said analog signal.

4. The display system of claim 2 including at least two DACs and logic OR means, having its inputs connected to receive said DAC analog signals and its output connected to said Set input for setting the flip-flop in response to any one of said DAC analog signals.

5. A method of self-testing in a video display system which includes a graphics processor and a digital to analog converter (DAC) having a digital input for inputting video data from the processor and an analog output for driving a graphics display monitor, the method comprising:
   providing self-test circuitry including a flip-flop having a Set input and an output defining to a test bit coupled to the processor;
   converting the DAC analog output signal to a digital signal;
   inputting the digital signal to the Set input of the flip-flop;
   performing at least one of the following tests: testing the DACs;
      testing the video frame buffer and shift registers for passing zeros;
      testing the video frame buffer and shift registers for passing ones; and
      testing the refresh counter address path into the video frame buffer;
   outputting the test bit from the flip-flop to the processor;
   comparing the test bit value to an expected test value for each test performed to detect an error; and
   in the event an error is detected, reporting the error.

6. The method of claim 5, wherein the display system includes a color map or grey scale map and testing the DAC comprises:
   loading the color map or grey scale map with all zeros;
   clearing the flip-flop;
   waiting at least a frame time;
   reading the test bit;
   comparing the test bit value to an expected value;
   loading the color map with all ones only in the section of the color map which corresponds to a selected color;
   waiting at least a frame time;
   reading the test bit;
   comparing the test bit value to an expected value.

7. The method of claim 5, wherein testing the frame buffer and shift registers for passing zero comprises:
   writing zeros to the entire video frame buffer;
   loading the zero location of the color map with zeros;
   loading the color map locations other than the zero location with ones;
   clearing the flip-flop;
   waiting at least a frame time;
   reading the test bit;
   comparing the test bit value to an expected value.

8. The method of claim 5, wherein testing the refresh counter address path includes:
   clearing the video frame buffer;
   loading the color map with ones, except for location zero;
   loading zeros into location zero of the color map;
   clearing the flip-flop;
   reading the refresh counter;
   setting one bit of a word in the frame buffer about to be displayed;
   reading the test bit;
   comparing the test bit value to an expected value; and
   repeating the foregoing steps for testing each of the other bits in the word.

9. The method of claim 5 wherein performing a test includes inputting a predetermined pattern of digital test data to the DAC; and
   the expected test value corresponds to the predetermined pattern of digital test data.

10. The method of claim 9 wherein the display system is an RGB color system having three DACs and the steps of claim 11 are performed for each DAC.

11. The method of claim 5, wherein testing the frame buffer and shift registers for passing a one comprises:
   setting one bit in the video frame buffer;
   clearing the flip-flop;
   waiting a time period sufficient for the set bit to be displayed;
   reading the test bit;
   comparing the test bit value to an expected value; and checking that only the correct shift register bit is set.

12. The method of claim 11, wherein said checking comprises:
- setting are bit of a selected word in all planes of the video frame buffer to one;
- clearing a location A of the color map, where N is the number of planes of video frame buffer and $A = 2^N - 1$;
- clearing the flip-flop;
- waiting a time period sufficient for the selected word to be displayed;
- reading the test bit;
- comparing the test bit value to an expected value; and
- repeating the above steps for each remaining bit in the selected word in the video frame buffer thereby testing all bits in the shift registers.

13. A method of self-testing in a video display system which includes a graphics processor and a digital to analog converter (DAC) having an input for inputting video data from a color map or grey scale and an analog output for driving a graphics display monitor, the method comprising:
- providing self-test circuitry including a flip-flop having a Set input coupled to the DAC output and an output defining a test bit coupled to input the test bit to an input port of the processor;
- writing digital test data to a selected one of the frame buffer and color map or grey scale;
- clearing the flip-flop;
- waiting a predetermined period of time;
- reading the test bit at the flip-flop output; and
- comparing the test bit value to an expected value.

* * * * *